US010504684B1

(12) United States Patent
Adamec (10) Patent No.: US 10,504,684 B1
(45) Date of Patent: Dec. 10, 2019

(54) HIGH PERFORMANCE INSPECTION SCANNING ELECTRON MICROSCOPE DEVICE AND METHOD OF OPERATING THE SAME

(71) Applicant: ICT Integrated Circuit Testing Gesellschaft für Halbleiterprüftechnik mbH, Heimstetten (DE)

(72) Inventor: Pavel Adamec, Haar (DE)

(73) Assignee: ICT Integrated Circuit Testing Gesellschaft für Halbleiterprüftechnik mbH, Heimstetten (DE)

( * ) Notice: Subject to any disclaimer, the term of this patent is extended or adjusted under 35 U.S.C. 154(b) by 0 days.

(21) Appl. No.: 16/033,987

(22) Filed: Jul. 12, 2018

(51) Int. Cl.
| | | |
|---|---|---|
| *H01J 37/14* | (2006.01) | |
| *H01J 37/09* | (2006.01) | |
| *H01J 37/073* | (2006.01) | |
| *H01J 37/063* | (2006.01) | |
| *H01J 37/28* | (2006.01) | |

(52) U.S. Cl.
CPC ............ *H01J 37/14* (2013.01); *H01J 37/063* (2013.01); *H01J 37/073* (2013.01); *H01J 37/09* (2013.01); *H01J 37/28* (2013.01); *H01J 2237/04732* (2013.01); *H01J 2237/04753* (2013.01); *H01J 2237/06341* (2013.01); *H01J 2237/083* (2013.01); *H01J 2237/1405* (2013.01); *H01J 2237/28* (2013.01)

(58) Field of Classification Search
CPC ........ H01J 37/28; H01J 37/14; H01J 2237/16; H01J 37/073; H01J 1/304; H01J 2203/0204; H01J 2237/06341; H01J 2237/1506; H01J 2237/1526; H01J 2237/2602; H01J 37/141; H01J 37/145; H01J 37/147; H01J 37/1472; H01J 37/1475; H01J 37/1478; H01J 37/244; H01J 37/26; H01J 9/025
USPC ........ 250/396 ML, 396 R, 442.11, 310, 311, 250/398, 492.1, 492.3
See application file for complete search history.

(56) References Cited

U.S. PATENT DOCUMENTS

| | | | | | |
|---|---|---|---|---|---|
| 4,214,162 | A | * | 7/1980 | Hoppe | ..................... H01J 37/04 250/311 |
| 4,547,669 | A | * | 10/1985 | Nakagawa | ............. B82Y 15/00 250/310 |
| 5,146,090 | A | * | 9/1992 | Plies | ....................... H01J 37/12 250/311 |
| 6,057,553 | A | * | 5/2000 | Khursheed | .............. H01J 37/14 250/442.11 |

(Continued)

*Primary Examiner* — David A Vanore
(74) *Attorney, Agent, or Firm* — Kilpatrick Townsend & Stockton LLP (57) ABSTRACT

A charged particle beam arrangement is described. The charged particle beam arrangement includes a charged particle source including a cold field emitter, a beam limiting aperture between the charged particle source and a magnetic condenser lens; the magnetic condenser lens comprising a first inner pole piece and a first outer pole piece, wherein a first axial distance between the charged particle source and the first inner pole piece is equal or less than approximately 20 mm, an acceleration section for accelerating the charged particle beam to an energy of 10 keV or more, a magnetic objective lens comprising a second inner pole piece and a second outer pole piece, a third axial distance between the second inner pole piece and a surface of a specimen is equal to or less than approximately 20 mm, and a deceleration section.

20 Claims, 3 Drawing Sheets

(56) References Cited

U.S. PATENT DOCUMENTS

| | | | | |
|---|---|---|---|---|
| 6,531,697 B1* | 3/2003 | Nakamura | ........... | H01J 37/1471 |
| | | | | 250/302 |
| 6,614,026 B1* | 9/2003 | Adamec | .............. | H01J 37/1478 |
| | | | | 250/396 ML |
| 9,633,815 B1* | 4/2017 | Adamec | ................ | H01J 37/073 |
| 9,847,208 B1* | 12/2017 | Adamec | ................ | H01J 37/073 |
| 2008/0121810 A1* | 5/2008 | Liu | ....................... | H01J 37/145 |
| | | | | 250/396 ML |
| 2012/0049064 A1* | 3/2012 | Ren | ....................... | H01J 37/141 |
| | | | | 250/310 |
| 2012/0217393 A1* | 8/2012 | Okai | ..................... | H01J 37/026 |
| | | | | 250/310 |
| 2014/0264062 A1* | 9/2014 | Adamec | .............. | H01J 37/1475 |
| | | | | 250/396 ML |

* cited by examiner

HIGH PERFORMANCE INSPECTION SCANNING ELECTRON MICROSCOPE DEVICE AND METHOD OF OPERATING THE SAME

FIELD

Embodiments of the present application relate to charged particle beam arrangements adapted, e.g. for inspection scanning electron microscopes, testing system applications, lithography system applications, integrated circuit testing, defect review, critical dimensioning applications or the like. Embodiments of the present application also relate to methods of operating a charged particle beam arrangement. Further, embodiments of the present application relate to inspection scanning electron devices using a charged particle beam arrangement.

BACKGROUND

Charged particle beam arrangements are widely used in a plurality of industrial fields, including, but not limited to, inspection of semiconductor devices and electronic circuits during manufacturing, exposure systems for lithography, detecting devices, defect inspection tools, and testing systems for integrated circuits. Semiconductor technologies have created a high demand for structuring and probing specimens in the nanometer or even in the sub-nanometer scale. Process control, inspection and/or structuring is often based on the use of charged particle arrangements providing charged particle beams, e.g. electron beams, which are generated and focused in charged particle beam arrangements, such as electron microscopes or electron beam pattern generators.

High performance inspection devices using charged particle beams such as scanning electron microscopes (SEM) offer superior spatial resolution compared to, e.g. photon beam arrangements because their probing wavelengths are shorter than the wavelengths of light beams. For instance in case of an SEM, the primary electron (PE) beam generates particles like secondary electrons (SE) and/or backscattered electrons (BSE) that can be used to image and analyze a specimen. In particular, a scanning electron microscope, SEM, can be used for high throughput, high resolution imaging process defects on wafers.

Prior art SEM columns may provide high-resolution of specimen structures. Wafer inspection SEM can be used for high throughput, high resolution imaging of process defects on a specimen such as a wafer. Many instruments use either electrostatic or compound electric-magnetic lenses to focus the primary beam onto the specimen. There is a need for inspection devices operating at a spatial resolution in the nanometer and sub-nanometer range at low landing energies.

As the features on a wafer become smaller the requirements of the resolution and throughput increase. For high resolution imaging devices based on electron optics systems, e.g. high resolution versus high probe current, and large image field versus small pixel size, respectively, are contradicting considerations. An electron optical system of a scanning electron microscope, SEM, which can fulfill these contradicting requirements, is beneficial.

SUMMARY

In light of the above, a charged particle beam arrangement according to claim 1 is provided. Furthermore, a method of operating a charged particle beam arrangement according to claim 12 is provided. Furthermore, an inspection scanning electron device having a charged particle beam arrangement according to claim 18 is provided.

According to one embodiment, a charged particle beam arrangement is provided. The charged particle beam arrangement includes a charged particle source including a cold field emitter having a tungsten tip; an extraction electrode assembly configured to extract a charged particle beam from the charged particle source; a beam limiting aperture between source and magnetic condenser lens; a magnetic condenser lens adapted for collimating the charged particle beam and comprising a first inner pole piece and a first outer pole piece, wherein a first axial distance between the charged particle source and the first inner pole piece is equal or less than approximately 20 mm and wherein the first axial distance is larger than a second axial distance between the charged particle source and the first outer pole piece; an acceleration section for accelerating the charged particle beam to an energy of 10 keV or more, a field of the magnetic condenser lens overlaps, at least partially, with the acceleration section; a magnetic objective lens comprising a second inner pole piece and a second outer pole piece, a third axial distance between the second inner pole piece and a surface of a specimen is equal to or less than approximately 20 mm, and wherein the third axial distance is larger than a fourth axial distance between the second outer pole piece and the surface of the specimen, a combined action of the magnetic condenser lens and the magnetic objective lens focuses the charged particle beam onto the surface of the specimen; and a deceleration section for decelerating the charged particle beam from the energy of 10 keV or more to a landing energy of 2 keV or below, a field of the magnetic objective lens overlaps, at least partially, with the deceleration section.

According to another embodiment, a method of operating a charged particle beam arrangement is provided. The method includes generating charged particles forming a charged particle beam with a cold field emitter having a tungsten tip; in an acceleration section, accelerating the charged particles; collimating the charged particle beam by a magnetic condenser lens; focusing the charged particle beam onto a surface of a specimen a combined action of the magnetic condenser lens and a magnetic objective lens having an inner pole piece and an outer pole piece, wherein an axial distance between the inner pole piece of the magnetic objective lens and the surface of a specimen amounts to less than approximately 20 mm, and wherein the axial distance is larger than a further axial distance between the outer pole piece and the surface of the specimen; and a deceleration section, decelerating the charged particles to a landing energy at the surface of the specimen.

According to yet another embodiment, an inspection scanning electron device is provided. The inspection scanning electron device includes a charged particle beam arrangement according to embodiments of the present disclosure.

Further features and details are evident from the dependent claims, the description and the drawings.

BRIEF DESCRIPTION OF THE DRAWINGS

So that the manner in which the above recited features of the present invention can be understood in detail, a more particular description of the invention, briefly summarized above, can be had by reference to embodiments. The accompanying drawings relate to embodiments of the invention and are described in the following.

It is contemplated that elements of one embodiment can be advantageously utilized in other embodiments without further recitation.

DETAILED DESCRIPTION

Reference will now be made in detail to the various embodiments of the invention, one or more examples of which are illustrated in the figures. Within the following description of the drawings, the same reference numbers refer to same components. Generally, only the differences with respect to individual embodiments are described. Each example is provided by way of explanation of the invention and is not meant as a limitation of the invention. Further, features illustrated or described as part of one embodiment can be used on or in conjunction with other embodiments to yield yet a further embodiment. It is intended that the description includes such modifications and variations.

In the following a charged particle beam arrangement according to some embodiments or components thereof will described. Embodiments described herein relate to a charged particle beam arrangement which includes a charged particle source adapted for generating charged particles. Furthermore, and extraction electrode is provided, which is adapted for extracting the charged particles from the charged particle source and for forming a charged particle beam. The charged particle beam is collimated by the condenser lens and then the collimated charged particle beam is focused onto a surface of a specimen, e.g. a wafer, by means of an objective lens. The objective lens includes an inner pole piece and an outer pole piece, wherein the inner pole piece is designed such to have a maximum distance between the inner pole piece and the surface of the specimen. It has been found that the contradicting requirements of beam current and resolution can be beneficially be provided with such an arrangement of the inner pole piece. Further, for example, the objective lens can have the inner pole piece being designed such that an inner diameter of the inner pole piece is equal to or larger than a distance between the inner pole piece and the surface of the specimen. It has been found that the contradicting requirements of scanning field of view and resolution can be beneficially be provided with such an arrangement of the inner pole piece.

In addition to the embodiments described herein relate to a method of operating a charged particle beam arrangement. The method includes generating charged particles in a charged particle source. In an acceleration section of the charged particle beam arrangement the charged particle beam is formed and the charged particles are accelerated. Then the charged particle beam is focused onto a surface of a specimen by means of the objective lens having an inner pole piece and an outer pole piece.

The method includes arranging the objective lens such that the inner diameter of the inner pole piece of the objective lens e.g. 25 mm or below, such as 20 mm or below, particularly 10 mm or below. Further, it may be equal to or larger than a distance between the inner pole piece of the objective lens and the surface of the specimen. In a deceleration section which is located downstream along a beam propagation path and an axis of the charged particle beam the charged particles are decelerated to a predefined landing energy at the surface of the specimen.

Furthermore, embodiments described herein relate to a scanning electron device comprising the charged particle beam arrangement, the scanning electron device being adapted for carrying out wafer review, critical dimensioning, or specimen inspection procedures.

As described herein, some discussions and descriptions relating to the generation of a charged particle beam are exemplarily described with respect to electrons in electron microscopes. However, other types of charged particles, e.g. positive ions, could be provided by the arrangement in a variety of different instruments. According to embodiments described herein, which can be combined with other embodiments, a charged particle beam is referred to as an electron beam.

A "specimen" as referred to herein includes, but is not limited to, semiconductor wafers, semiconductor workpieces, and other workpieces such as memory disks and the like. Generally, when referring to a "surface of the specimen", it is understood that this surface is the wafer surface where the interaction with the focused charged particle beam takes place. As such the specimen includes a surface to be structured or a surface on which layers are deposited. A "specimen holder" as referred to herein includes, but is not limited to, a mechanically fixed or movable arrangement such as a specimen stage.

According to some embodiments, which can be combined with other embodiments described herein, the apparatus and methods can be configured for or can be applied for electron beam inspection, for critical dimensioning processes and defect review monitoring. Generally, when referring to a "beam current", it is understood that the beam of charged particles carries a predetermined charge. The charged particle beam device can be in particular used for high speed scanning and detection, for example for electron beam inspection systems (EBI).

Figure 1:
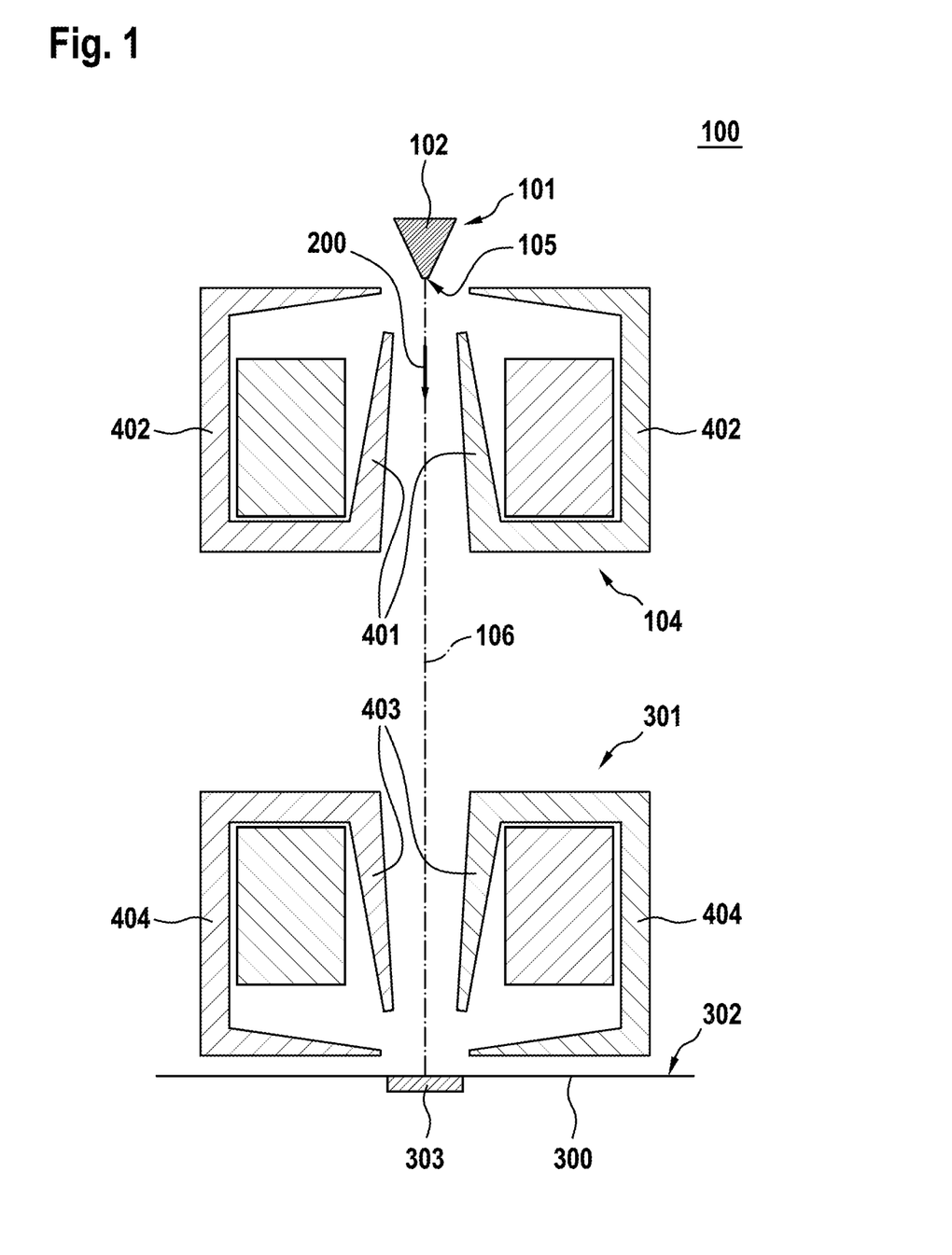
FIG. 1 shows schematically the principle setup of a charged particle beam arrangement according to an embodiment.

FIG. 1 shows schematically the principle setup of a charged particle beam arrangement 100 according to an embodiment. A charged particle source 101 is provided for generating charged particles. A beam path 200 of the charged particles is defined by an optical axis 106 of a charged particle beam. The charged particle beam is collimated by a condenser lens 104 which is located in the vicinity of the charged particle source 101. Downstream along the optical axis 106 an objective lens at 301 is arranged. The objective lens 301 is located in the vicinity of the specimen 300. The specimen 300 is held by a specimen holder 303. A surface of the specimen 302 facing the objective lens 301 is located at a predetermined distance with respect to the objective lens 301. According to embodiments described herein, the objective lens 301 includes an inner pole piece 403 and an outer pole piece 404, wherein in inner diameter of the inner pole piece 403 is equal to or larger than a distance between the inner pole piece 403 and the surface 302 of the specimen 300.

According to some embodiments, the magnetic objective lens, and optionally also the magnetic condenser lens is an axial gap lens. An axial distance between the inner pole piece of the magnetic objective lens and a surface of a specimen is larger than axial distance between the outer pole piece of the magnetic objective lens and the specimen. For example, the gap between the inner pole piece and the outer pole piece can extend along the optical axis of the objective lens. For example, according to some embodiments of the present disclosure, an axial distance between the inner pole piece of the magnetic objective lens and a surface of a specimen amounts to less than approximately 20 mm.

According to an embodiment which can be combined with other embodiments described herein, the charged particle source 101 can include a cold field emitter. According to yet another modification thereof, the cold field emitter can include a tungsten single crystal 102 which can have a tip 105, such as a sharp tip, the tip being configured for field emission by tunneling. The advantage of the cold field emission source is that a charged particle beam with high density can be obtained. A virtual source size of such a source is small. In order to be able to benefit from the high beam density the subsequent optical system is carefully designed.

Figure 2:
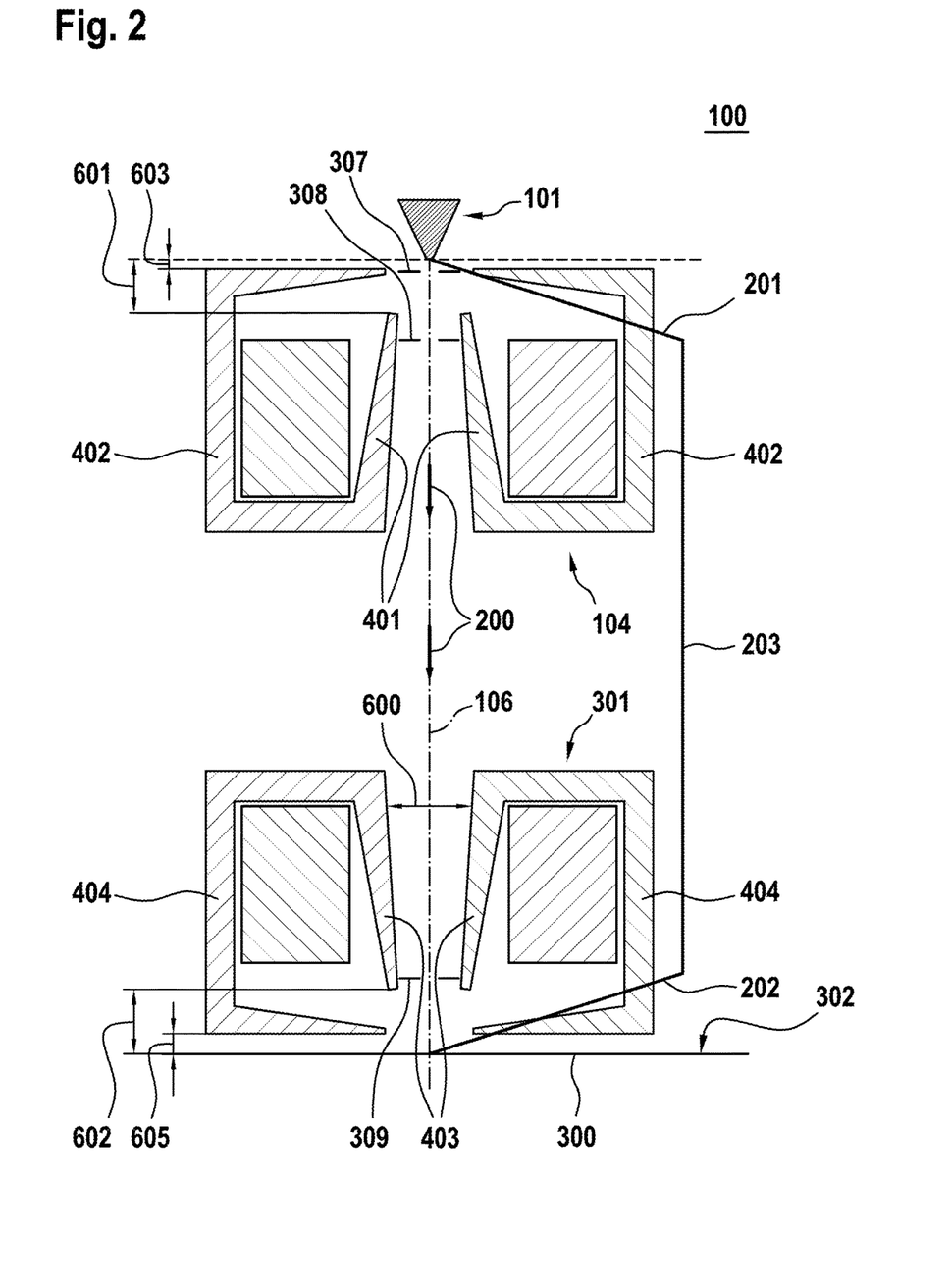
FIG. 2 illustrates an electron energy profile provided by the charged particle beam arrangement shown in FIG. 1.

FIG. 2 illustrates an electron energy profile 203 provided by the charged particle beam arrangement 100 shown in FIG. 1. A reference numeral 200 denotes a beam path of the charged particles from the charged particle source 101 to the surface 302 of the specimen 300. According to an embodiment which can be combined with other embodiments described herein, the charged particle beam arrangement 100 includes at least one acceleration section 201 adapted for accelerating the charged particles to a predetermined energy and at least one deceleration section 202 adapted for decelerating the charged particles to a predetermined landing energy. If electrons are considered, the acceleration section 201 can provide an acceleration of the charged particles to an energy of at least 10 keV, particularly at least 15 keV, and in particular to an energy of at least 30 keV.

According to embodiments of the present disclosure, an extraction electrode 307 can be provided. The extraction electrode can have a positive voltage to apply an extraction field for the emission mechanism. The extraction main mechanism of a cold field emitter is a tunneling effect through the surface potential barrier of the tip surface. This can be controlled by the extraction field of the extraction electrode 307. Further, according to some embodiments, the extraction electrode accelerates the electrons. The extraction electrode can provide a portion of the acceleration section 201. An acceleration electrode 308 can be provided as a portion of the acceleration section. According to some embodiments, which can be combined with other embodiments described herein, the acceleration section can extend from the emitter the acceleration electrode 308. An acceleration field strength may be about 3 kV/mm or slightly above. An acceleration can be e.g. up to 30 kV. The electrons can travel on a high energy from the acceleration electrode 308 to the electrode 309. The electrode can be provided as a portion of the deceleration section 202. According to some embodiments, which can be combined with other embodiments described herein, the deceleration section can extend from the electrode 309 to the specimen or a proxi electrode. A deceleration field strength may be about 3 kV/mm or slightly above. The electrons can be decelerated by a potential difference between the electrode 309 and a further electrode, such as a proxi electrode, or between the electrode 309 and the specimen. For example, a proxi electrode can be provided between the objective lens and the specimen. The deceleration section and the acceleration section may overlap with respective fields of the objective lens and the condenser lens.

According to an embodiment which can be combined with other embodiments described herein, the condenser lens 104 can be arranged such that a field of the condenser lens 104 overlaps, at least partially, the acceleration section 201 within the charged particle beam path 200. According to some embodiments, an electrode, e.g. the extraction electrode, can be provided between the charged particle source 101 and condenser lens to provide the acceleration section.

The deceleration section 202 can provide a deceleration of the charged particles from a high energy to a landing energy which amounts to approximately 3 keV or below, and in particular amounts to approximately 1 keV or below.

According to an embodiment which can be combined with other embodiments described herein, the objective lens 301 can be arranged such that a field of the objective lens 301 overlaps, at least partially, the deceleration section 202 within the charged particle beam path 200. According to some embodiments, a further electrode can be provided between the objective lens and a specimen support to provide the deceleration section. The further electrode may act as an electrostatic lens portion of the objective lens.

Between the acceleration section 201 and the deceleration section 202 the energy of the charged particles along the beam path 200 of the charged particles can be approximately constant, i.e. the energy of the charged particles, in this case electrons, can be at a level of approximately 10 keV or higher, such as 30 keV or higher. In the context of the present disclosure a predetermined landing energy is an energy which is suitable for an interaction of the charged particles with the wafer structures, i.e. the structures on the surface 302 or on surface regions of the specimen 300, before landing on the wafer surface 302.

As described herein, some discussions and descriptions relating to the generation of a charged particle beam are exemplarily described with respect to electrons. In this context FIG. 2 exhibits an electron energy profile 203. In an acceleration section 201 the energy of the charged particles is increased from a low level to a high level, wherein at the deceleration section 202 the energy of the charged particles is reduced from a high level to a landing energy of the charged particles, e.g. electrons, on the surface 302 of the specimen 300. The acceleration and the deceleration of the charged particles takes place along the beam propagation path 200 which approximately coincides with an optical axis 106, i.e. the axis of the charged particle beam.

As shown in FIG. 2, the charged particle beam arrangement 100 includes at least one condenser lens 104 and at least one objective lens 301. The combined action of the two lenses provides both the formation of an electron beam by collimating the charged particles originating from the charged particle source 101 and the focusing of the electron beam onto a specific location on the surface 302 of the specimen 300. The spot of the electron beam at the specific location on the surface 302 can have a predefined size. Furthermore, a predefined probe current of the electron beam at the location of the surface 302 of the specimen 300 can be provided.

According to an embodiment which can be combined with other embodiments described herein, focusing the electron beam onto a specific location on the surface 302 of the specimen 300 can include providing a combined action of a field of the condenser lens 104 and a field of the objective lens 301. In particular, the condenser lens 104 and the objective lens 301 can be arranged with respect to each other such that the charged particle beam is focused onto the surface of the specimen by a combined action of both a field of the condenser lens 104 and a field of the objective lens 301.

According to an embodiment which can be combined with other embodiments described herein, the condenser lens 104 can be provided as a magnetic condenser lens. According to yet another embodiment which can be combined with other embodiments described herein, the objective lens 301 can be provided as a magnetic objective lens. A deceleration may act as a further electrostatic lens component to have a combined magnetic-electrostatic objective lens.

According to yet another alternative, the condenser lens 104 and the objective lens 301 can be arranged approximately symmetrically with respect to each other and the axis 106 of the charged particle beam. This symmetrical arrangement of the condenser lens 104 and the objective lens 301 has the advantage, that the setup of the charged particle beam arrangement 100 can be simplified.

For example, embodiments described herein provide a charged particle beam arrangement. The arrangement includes a charged particle source 101 including a cold field emitter having a tungsten tip and an extraction electrode assembly or an extraction electrode 307 configured to extract a charged particle beam from the charged particle source. A magnetic condenser lens 104 is adapted for collimating the charged particle beam. The condenser lens includes a first inner pole piece 401 and a first outer pole piece 402, wherein a first axial distance 601 between the charged particle source and the first inner pole piece is equal or less than approximately 20 mm and wherein the first axial distance is larger than a second axial distance 603 between the charged particle beam source and the first outer pole piece. A magnetic objective lens 301 includes a second inner pole piece 403 and a second outer pole piece 404. A third axial distance 602 between the second inner pole piece and a surface of a specimen is equal to or less than approximately 20 mm, and wherein the third axial distance is larger than a fourth axial distance 605 between the second outer pole piece and the surface of the specimen. The combined action of the magnetic condenser lens and the magnetic objective lens focuses the charged particle beam onto the surface of the specimen.

The first axial distance 601 and the third axial distance 603 can be substantially the same. Further, the second axial distance 603 and the fourth axial distance 605 can be substantially the same. According to yet further embodiments, which can be combined with other embodiments described herein, the condenser lens includes an inner pole piece and an outer pole piece, wherein the inner pole piece is designed such that an inner diameter of the inner pole piece is equal to or larger than a distance between the inner pole piece and the tip of the emitter.

Furthermore, embodiments described herein relate to a method of operating a charged particle beam arrangement 100. The method provides generating charged particles by means of the charged particle source 101. In the acceleration section 201, the charged particle beam is formed and the charged particles are accelerated to a predetermined charged particle energy of approximately 10 keV or higher. The charged particle beam is collimated by means of the condenser lens 104. According to an embodiment, the condenser lens 104 includes an inner pole piece 401 and an outer pole piece 402. The charged particle beam propagates along the beam propagation path 200, which can coincide with the optical axis 106 of the charged particle beam. At the location of the objective lens 301, the charged particle beam is focused onto the surface 302 of the specimen 300 by means of the objective lens 301.

The objective lens 301 is designed such that it includes an inner pole piece 403 having an inner diameter 600, and an outer pole piece 404, wherein the inner diameter 600 of the inner pole piece 403 is equal to or larger than a distance 602 between the inner pole piece 403 and the surface 302 of the specimen 300. In a deceleration section 202 the charged particle is decelerated to a predetermined landing energy at the surface 302 of the specimen 300, the landing energy amounting to approximately 2 keV or below, and in particular amounting to approximately 1 keV or below.

Figure 3:
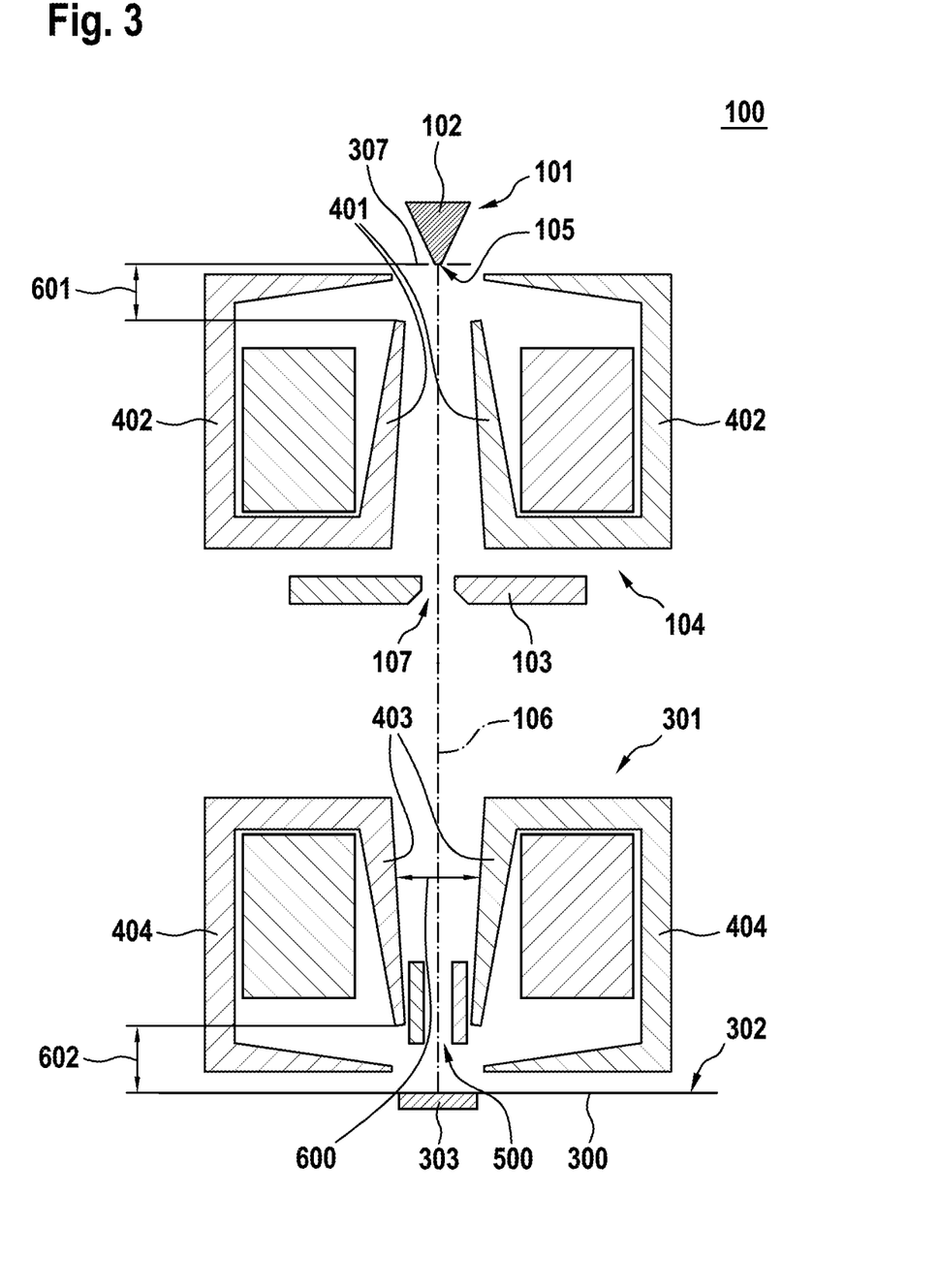
FIG. 3 shows an inspection scanning electron device according to an embodiment.

FIG. 3 shows an inspection scanning electron device according to another embodiment. The inspection scanning electron device includes the charged particle beam arrangement 100 having at least one condenser lens 104 and at least one objective lens 301. The charged particle beam arrangement 100 includes a charged particle source 101 adapted for generating charged particles, e.g. electrons. The source of the electrons can be of the cold field emission type, the cold field emission type providing field emission of electrons from an emitting surface located in the charged particle source 101. The cold field emission type electron source has the advantage, that it can be operated close to or below room temperature. Herein the main emission mechanism is the tunneling effect through the surface potential barrier controlled by an applied extraction field.

According to an embodiment which can be combined with other embodiments described herein, the charged particle source 101 can be provided as a single crystal 102. According to yet another modification thereof, the material of the single crystal 102 can be tungsten. Furthermore, the charged particle source 101 formed as a tungsten single crystal 102 can be provided with a sharp tip 105 which is adapted for emitting the charged particles. For example, the tungsten single crystal 102 can be etched into the form of the sharp tip 105. For example, the single crystal can have a (3,1,0) orientation.

As shown in FIG. 3, an extraction electrode 307 is provided between the condenser lens 104 and the objective lens 301. The extraction electrode 307 is adapted for extracting the charged particles from the charged particle source 101 and for forming a charged particle beam. If electrons are considered as representing the charged particles, a positive voltage with respect to the source 101 is applied at the extraction electrode 307, i.e. the extraction electrode has a positive electrical potential with respect to the tip 105 of the single crystal 102 in the charged particle source 101.

According to an embodiment which can be combined with other embodiments described herein, the extraction electrode can include a beam-limiting aperture, the beam-limiting aperture being adapted for passing the charged particles, e.g. electrons, therethrough.

According to further embodiments, which can be combined with other embodiments described herein, and as exemplarily shown in FIG. 3, an beam-limiting aperture 107 can be provided between the condenser lens 104 and the objective lens 301. For example, the beam-limiting aperture 107 can be positioned such that the center of the beam-limiting aperture 107 approximately coincides with the optical axis 106 of the charged particle beam.

According to an embodiment which can be combined with other embodiments described herein, the objective lens 301 which is designed for focusing the charged particle beam onto the surface 302 of the specimen 300 includes an inner pole piece 403 and an outer pole piece 404. The inner pole piece 403 of the objective lens 301 has a diameter which is denoted by a reference numeral 600 in FIG. 3.

According to an embodiment of the lens arrangement the design of the objective lens 301 can be such that a ratio of the diameter 600 of the inner pole piece 403 of the objective lens 301 and its distance 602 from the surface 302 of the specimen 300, i.e. from the wafer plane is larger than or equal to one. In other words, the inner diameter 600 of the inner pole piece 403 of the objective lens 301 can be equal to or larger than a distance 602 between the inner pole piece 403 and the surface 302 of the specimen 300.

According to embodiments, which can be combined with other embodiments described herein, the lens arrangement has design of the condenser lens 104 can be such that a ratio of the diameter 604 of the inner pole piece 401 of the condenser lens 104 and its distance 601 from the tip 105 of the charged particle source 101 is larger than or equal to one.

According to an embodiment which can be combined with other embodiments described herein, an axial distance 602 between the inner pole piece 403 of the objective lens 301 and the surface 302 to of the specimen 300 can amount to less than approximately 25 mm, and in particular can amount to less than approximately 10 mm. An advantage of such an arrangement of the objective lens 301 with respect to the surface 302 of the specimen 300 is that the focusing properties of the objective lens 301 can be improved. In other words, the axial distance 602, i.e. a wafer-side distance of the inner pole piece 403 of the objective lens 301 with respect to the surface 302 of the specimen 300, i.e. the wafer plane, can determine the quality of the focusing properties of the objective lens 301.

According to an embodiment which can be combined with other embodiments described herein, the condenser lens 104 can include an inner pole piece 401 and an outer pole piece 402. According to yet another modification thereof, an axial distance 601 between the charged particle source 101, or the tip 105 of the single crystal 102 of the charged particle source 101, respectively, and the inner pole piece 401 of the condenser lens 104 can amount to less than approximately 20 mm, and in particular can amount to less than approximately 10 mm. An advantage of such an arrangement of the condenser lens 104 with respect to the emitter tip 105 of the charged particle source 101 is that the collimation properties of the condenser lens 104 can be improved. In other words, the axial distance 601, i.e. a source-side distance of the inner pole piece 401 of the condenser lens 104 with respect to the tip 105 of the charged particle source 101 can determine the quality of the collimation properties of the condenser lens 104.

As shown in FIG. 3, in the inspection scanning electron device, the charged particle beam arrangement 100 is provided with a scanning deflector unit 500. The scanning deflector unit 500 is adapted for scanning the charged particle beam propagating along the optical axis 106 across the surface 302 of the specimen 300. The scanning deflector unit 500 can be provided, e.g. as a scanning coil or a pair of deflector plates. Thereby, the charged particle beam can be scanned across the surface 302, e.g. in a raster fashion over a rectangular area of the specimen surface 302.

According to an embodiment which can be combined with other embodiments described herein, the scanning deflector unit can be positioned between the extraction electrode 307 and the objective lens 301. According to another modification thereof, the scanning deflector unit 500 can be positioned in the vicinity of a field of the objective lens 301. According to an embodiment which can be combined with other embodiments described herein, a size of an achievable scanning field provided by the scanning deflector unit 500 is determined by the ratio of the diameter 600 of the inner pole piece 403 of the objective lens 301 and its distance 602 from the wafer plane 302. According to another modification thereof, the ratio of the diameter 600 and the distance 602 indicated in FIG. 3 is at least one, in particular at least two.

According embodiments, which can be combined with other embodiments described herein, the apparatus and methods can be configured for or can be applied for electron beam inspection systems, for critical dimensioning applications and defect review applications. In particular, the charged particle beam device according to embodiments described herein can be used as a charged particle beam inspection device which can be designed e.g. for defect review applications, for testing integrated circuits, for critical dimensioning analysis, for high speed scanning, etc. In particular, if electrons are used as the charged particles, the charged particle beam inspection device can be designed as an electron beam inspection (EBI) device.

While the foregoing is directed to embodiments of the invention, other and further embodiments of the invention can be devised without departing from the basic scope thereof, and the scope thereof is determined by the claims that follow.

The invention claimed is:

1. A charged particle beam arrangement, comprising:
a charged particle source including a cold field emitter having a tungsten tip;
an extraction electrode assembly configured to extract a charged particle beam from the charged particle source;
a beam limiting aperture between the charged particle source and a magnetic condenser lens;
the magnetic condenser lens adapted for collimating the charged particle beam and comprising a first inner pole piece and a first outer pole piece, wherein a first axial distance between the charged particle source and the first inner pole piece is equal or less than approximately 20 mm and wherein the first axial distance is larger than a second axial distance between the charged particle source and the first outer pole piece;
an acceleration section for accelerating the charged particle beam to an energy of 10 keV or more, a field of the magnetic condenser lens overlaps, at least partially, with the acceleration section;
a magnetic objective lens comprising a second inner pole piece and a second outer pole piece, a third axial distance between the second inner pole piece and a surface of a specimen is equal to or less than approximately 20 mm, and wherein the third axial distance is larger than a fourth axial distance between the second outer pole piece and the surface of the specimen, a combined action of the magnetic condenser lens and the magnetic objective lens focuses the charged particle beam onto the surface of the specimen; and
a deceleration section for decelerating the charged particle beam from the energy of 10 keV or more to a landing energy of 2 keV or below, a field of the magnetic objective lens overlaps, at least partially, with the deceleration section.

2. The charged particle beam arrangement of claim 1, wherein the first inner pole piece has a first inner diameter, the first inner diameter is equal to or larger than the first axial distance.

3. The charged particle beam arrangement of claim 1, wherein the second inner pole piece has a second inner diameter, the second inner diameter is equal to or larger than the third axial distance.

4. The charged particle beam arrangement according to claim 1, wherein the beam limiting aperture is included in the extraction electrode assembly.

5. The charged particle beam arrangement according to claim 1, wherein the magnetic objective lens is an axial gap lens.

6. The charged particle beam arrangement according to claim 1, wherein the first axial distance between the charged particle source and the first inner pole piece of the magnetic condenser lens is equal or less approximately 10 mm.

7. The charged particle beam arrangement according to claim 1, wherein the magnetic condenser lens and the magnetic objective lens are arranged approximately symmetrically with respect to each other along an axis of the charged particle beam.

8. The charged particle beam arrangement according to claim 1, wherein the third axial distance between the second inner pole piece of the magnetic objective lens and the surface of the specimen amounts to less than approximately 10 mm.

9. The charged particle beam arrangement according claim 1, wherein the beam-limiting aperture is configured for axially passing the charged particle beam through the beam-limiting aperture and to reduce the beam current of the charged particle beam.

10. The charged particle beam arrangement according to claim 1, wherein the tungsten tip is a tungsten single crystal with (3,1,0) orientation.

11. The charged particle beam arrangement according to claim 1, further comprising:
a scanning deflector unit adapted for scanning the charged particle beam across the surface of the specimen, the scanning deflector unit being positioned between the extraction electrode and the magnetic objective lens, and in particular is positioned in the vicinity of a field of the magnetic objective lens.

12. A method of operating a charged particle beam arrangement, the method comprising:
generating charged particles forming a charged particle beam with a cold field emitter having a tungsten tip;
in an acceleration section, accelerating the charged particles;
collimating the charged particle beam by a magnetic condenser lens;
focusing the charged particle beam onto a surface of a specimen a combined action of the magnetic condenser lens and a magnetic objective lens having an inner pole piece and an outer pole piece, wherein an axial distance between the inner pole piece of the magnetic objective lens and the surface of a specimen amounts to less than approximately 20 mm, and wherein the axial distance is larger than a further axial distance between the outer pole piece and the surface of the specimen; and
a deceleration section, decelerating the charged particles to a landing energy at the surface of the specimen.

13. The method according to claim 12, wherein the magnetic objective lens is an axial gap lens.

14. The method according to claim 12, wherein a field of the magnetic condenser lens overlaps, at least partially, with the acceleration section.

15. The method according to claim 12, wherein a field of the magnetic objective lens overlaps, at least partially, with the deceleration section.

16. The method according to claim 12, wherein, in the acceleration section, the charged particles are accelerated to an energy of at least 10 keV, particularly at least 15 keV, and in particular to an energy of at least 30 keV.

17. The method according to claim 12, wherein, in the deceleration section, the charged particles are decelerated to a landing energy is approximately 3 keV or below, and in particular approximately 1 keV or below.

18. An scanning electron device comprising:
a charged particle beam arrangement, comprising:
a charged particle source including a cold field emitter having a single crystal tip;
an extraction electrode assembly configured to extract a charged particle beam from the charged particle source;
a beam limiting aperture between the charged particle source and a magnetic condenser lens;
the magnetic condenser lens adapted for collimating the charged particle beam and comprising a first inner pole piece and a first outer pole piece, wherein a first axial distance between the charged particle source and the first inner pole piece is equal or less than approximately 20 mm and wherein the first axial distance is larger than a second axial distance between the charged particle source and the first outer pole piece;
an acceleration section for accelerating the charged particle beam to an energy of 10 keV or more, a field of the magnetic condenser lens overlaps, at least partially, with the acceleration section;
a magnetic objective lens comprising a second inner pole piece and a second outer pole piece, a third axial distance between the second inner pole piece and a surface of a specimen is equal to or less than approximately 20 mm, and wherein the third axial distance is larger than a fourth axial distance between the second outer pole piece and the surface of the specimen, a combined action of the magnetic condenser lens and the magnetic objective lens focuses the charged particle beam onto the surface of the specimen; and
a deceleration section for decelerating the charged particle beam from the energy of 10 keV or more to a landing energy of 2 keV or below, a field of the magnetic objective lens overlaps, at least partially, with the deceleration section.

19. The scanning electron device arrangement of claim 18, wherein the first inner pole piece has a first inner diameter, the first inner diameter is equal to or larger than the first axial distance.

20. The scanning electron device arrangement of claim 18, wherein the magnetic objective lens is an axial gap lens.

* * * * *